(12) United States Patent
Zeiler et al.

(10) Patent No.: US 9,076,781 B2
(45) Date of Patent: Jul. 7, 2015

(54) SUPPORT DEVICE FOR A SEMICONDUCTOR CHIP AND OPTOELECTRONIC COMPONENT WITH A CARRIER DEVICE AND ELECTRONIC COMPONENT WITH A CARRIER DEVICE

(75) Inventors: Thomas Zeiler, Nittendorf (DE); Lai Sham Khong, Ipoh (MY)

(73) Assignee: OSRAM Opto Semiconductors GmbH, Regensburg (DE)

( * ) Notice: Subject to any disclaimer, the term of this patent is extended or adjusted under 35 U.S.C. 154(b) by 158 days.

(21) Appl. No.: 13/810,651

(22) PCT Filed: Jun. 27, 2011

(86) PCT No.: PCT/EP2011/060742
§ 371 (c)(1),
(2), (4) Date: Jun. 18, 2013

(87) PCT Pub. No.: WO2012/007271
PCT Pub. Date: Jan. 19, 2012

(65) Prior Publication Data
US 2013/0256862 A1 Oct. 3, 2013

(30) Foreign Application Priority Data

Jul. 16, 2010 (DE) .......................... 10 2010 027 313

(51) Int. Cl.
| | |
|---|---|
| *H01L 23/495* | (2006.01) |
| *H01L 23/00* | (2006.01) |
| *H01L 33/62* | (2010.01) |
| *H01S 5/022* | (2006.01) |

(Continued)

(52) U.S. Cl.
CPC ....... *H01L 23/49575* (2013.01); *H01L 23/3107* (2013.01); *H01L 23/49548* (2013.01); *H01L 23/49582* (2013.01); *H01L 23/564* (2013.01); *H01L 33/486* (2013.01); *H01L 33/62* (2013.01); *H01L 2224/48091* (2013.01); *H01L 2224/48227* (2013.01); *H01L 2224/48247* (2013.01); *H01L 2224/85444* (2013.01); *H01L 2224/85455* (2013.01); *H01L 2224/85464* (2013.01); *H01L 2924/01046* (2013.01); *H01L 2924/01078* (2013.01); *H01L 2924/01079* (2013.01); *H01S 5/02244* (2013.01); *H01S 5/02276* (2013.01); *H01L 24/48* (2013.01); *H01L 2924/12041* (2013.01); *H01L 2924/3025* (2013.01)

(58) Field of Classification Search
CPC .......................... H01L 31/143; H01L 31/162
See application file for complete search history.

(56) References Cited

U.S. PATENT DOCUMENTS

| | | |
|---|---|---|
| 4,183,611 A | 1/1980 | Casciotti et al. |
| 4,950,623 A | 8/1990 | Dishon |

(Continued)

FOREIGN PATENT DOCUMENTS

| | | |
|---|---|---|
| DE | 100 10 979 A1 | 9/2001 |
| DE | 103 51 120 A1 | 6/2005 |

(Continued)

*Primary Examiner* — Kyoung Lee
(74) *Attorney, Agent, or Firm* — Slater & Marsil, L.L.P.

(57) ABSTRACT

A carrier device for a semiconductor chip includes a bondable and/or solderable metallic carrier having a mounting region for the semiconductor chip and a soldering region. The carrier is at least partly covered with a covering material. A solder barrier is arranged between the soldering region and the mounting region at an interface between the carrier and the covering material. An electronic component and an optoelectronic component are furthermore specified.

17 Claims, 4 Drawing Sheets

(51) Int. Cl.
*H01L 23/31* (2006.01)
*H01L 33/48* (2010.01)

(56) References Cited

U.S. PATENT DOCUMENTS

| | | | |
|---|---|---|---|
| 5,973,337 | A | 10/1999 | Knapp et al. |
| 6,180,962 | B1 | 1/2001 | Ishinaga |
| 6,545,344 | B2 * | 4/2003 | Abbott ............... 257/666 |
| 7,365,371 | B2 * | 4/2008 | Andrews ............... 257/99 |
| 2001/0054750 | A1 | 12/2001 | Abbott |
| 2005/0253258 | A1 | 11/2005 | Steers et al. |
| 2006/0227087 | A1 | 10/2006 | Hajjar et al. |
| 2010/0102436 | A1 * | 4/2010 | Eng et al. ............... 257/692 |

FOREIGN PATENT DOCUMENTS

| | | |
|---|---|---|
| DE | 10 2008 053 489 A1 | 4/2010 |
| DE | 10 2009 008 738 A1 | 8/2010 |
| EP | 0 996 172 A1 | 4/2000 |
| JP | 61107751 A | 5/1986 |
| JP | 1174555 A | 3/1999 |
| JP | 200068303 A | 3/2000 |
| JP | 2000133845 A | 5/2000 |
| JP | 2009-049352 A | 3/2009 |
| TW | 200910553 A | 3/2009 |

* cited by examiner

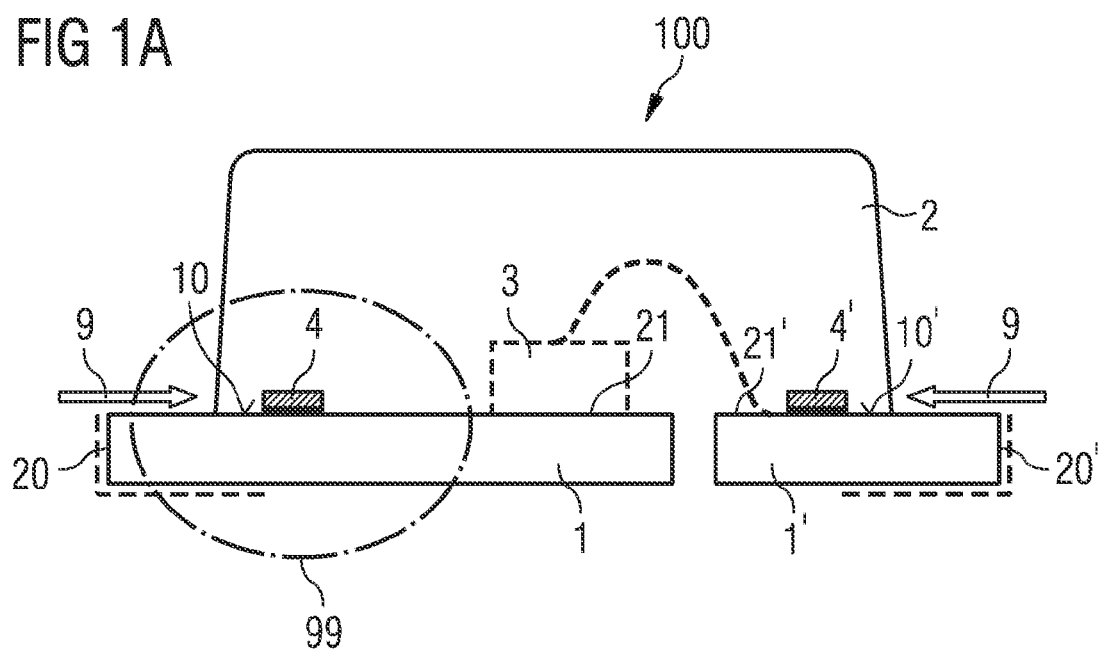
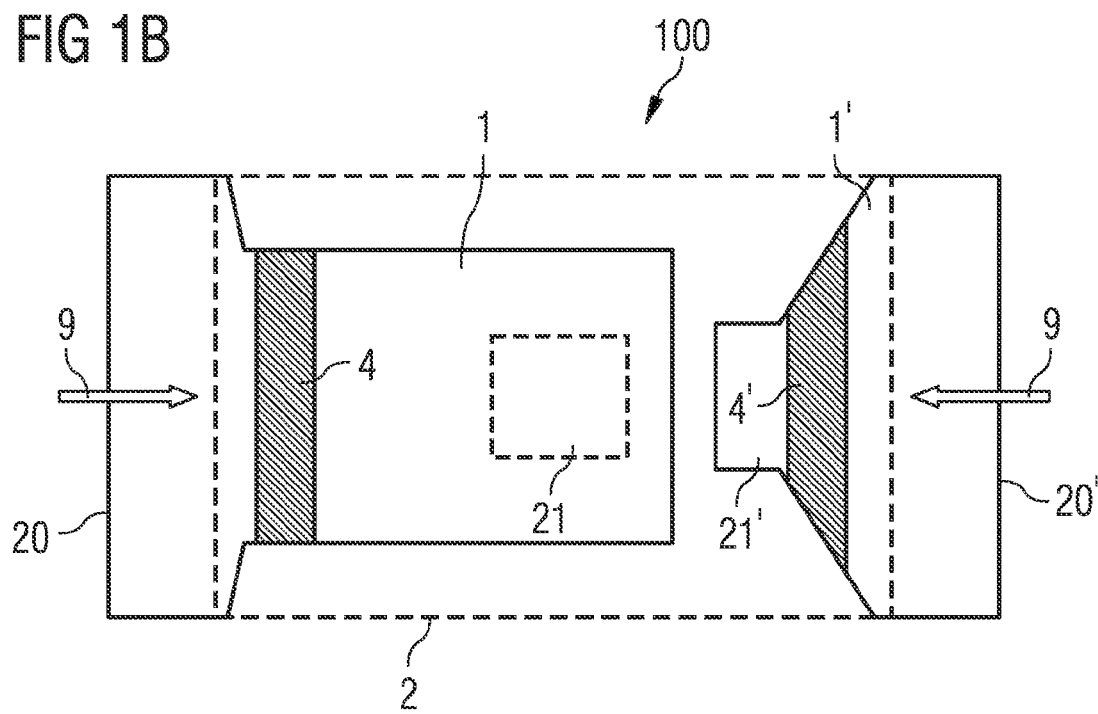

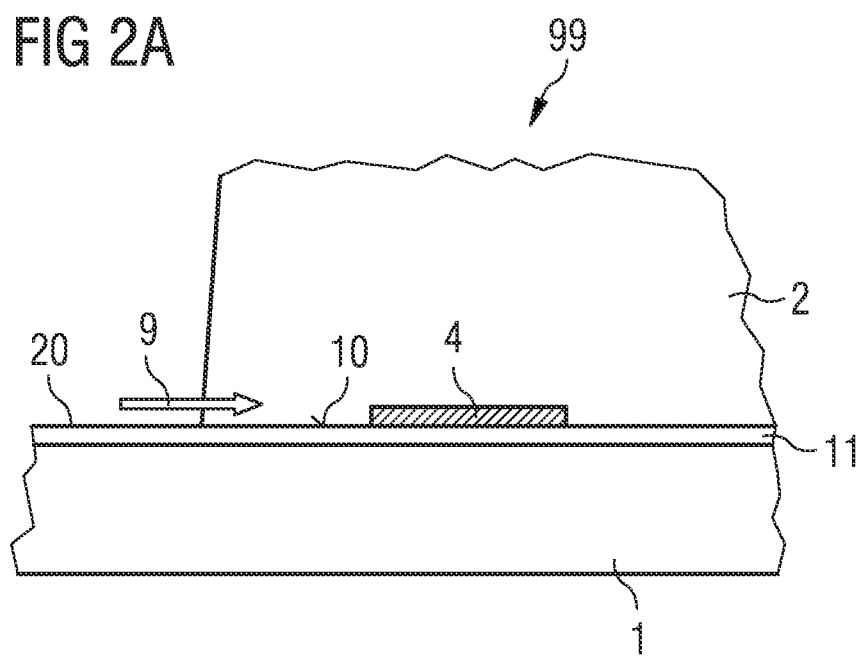
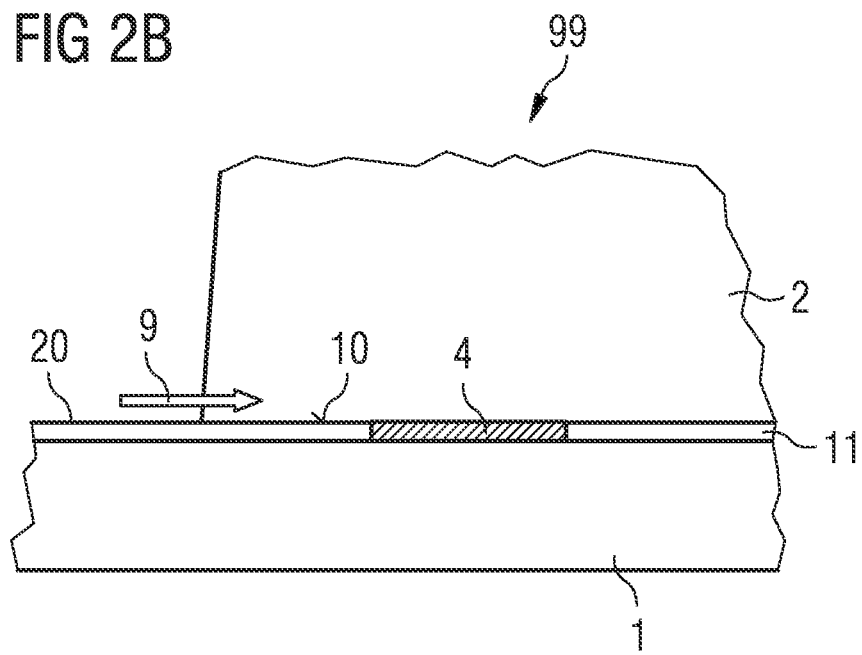

SUPPORT DEVICE FOR A SEMICONDUCTOR CHIP AND OPTOELECTRONIC COMPONENT WITH A CARRIER DEVICE AND ELECTRONIC COMPONENT WITH A CARRIER DEVICE

This patent application is a national phase filing under section 371 of PCT/EP2011/060742, filed Jun. 27, 2011, which claims the priority of German patent application 10 2010 027 313.9, filed Jul. 16, 2010, each of which is incorporated herein by reference in its entirety.

TECHNICAL FIELD

A carrier device for a semiconductor chip, an electronic component comprising a carrier device and an optoelectronic component comprising a carrier device are specified.

BACKGROUND

Light-emitting diodes (LEDs) typically comprise a housing in which a leadframe is embedded. An LED chip is arranged on the leadframe within the housing. Such an LED is usually adhesively bonded to a carrier by means of connections of the leadframe that are led from the housing toward the outside. Since the connection of the housing to the leadframe typically cannot be embodied continuously in such a way as to achieve hermetic sealing of the interior of the housing relative to the exterior, micro-gaps and permeation paths along the interface between the housing and the leadframe occur, through which soldering material can creep into the interior of the housing during the soldering process. The soldering material can thereby form a thin film that covers the leadframe within the housing in an uncontrollable manner. Such an effect is therefore unacceptable for the production of reliable and high-quality LEDs. The creep effect can additionally be intensified if the LED is repeatedly soldered on and de-soldered.

A similar effect is known for substrate-like chip carriers such as, for instance, ceramic carriers with conductor tracks or circuit boards in which the conductor tracks are covered in places with a plastics material which serves as a soldering resist, for example, and under which solder can creep along the interface between the plastics material and the conductor track.

SUMMARY OF THE INVENTION

Embodiments of the invention specify a carrier device for a semiconductor chip wherein such a solder creep effect can be at least reduced. Further embodiments specify an electronic component and an optoelectronic component comprising such a carrier device.

In accordance with at least one embodiment, a carrier device for a semiconductor chip comprises a bondable and/or solderable metallic carrier having a mounting region for the semiconductor chip and having a soldering region. In this case, "bondable" means, in particular, that the metallic carrier is provided and suitable for enabling a semiconductor chip to be fixed, for example by means of so-called "die attach" or chip adhesive bonding, and/or for enabling a contact wire to be fixed by means of "wire bonding" or wire contact-connection. By way of example, for this purpose the metallic carrier can have a suitable layer in the form of a bondable coating. The soldering region is provided and suitable for soldering the carrier and thus the carrier device to a suitable electrical contact. By way of example, the carrier device can be soldered onto a contact point or a conductor track of a ceramic carrier or a circuit board.

In accordance with a further embodiment, the carrier is at least partly covered with a covering material, such that an interface is formed between the carrier and the covering material. The covering material can be arranged in particular in a manner adjoining the carrier between the soldering region and the mounting region for the semiconductor chip, such that the carrier and the covering material have a common interface. A solder barrier is arranged at the interface between the carrier and the covering material, said solder barrier being suitable for reducing along the interface solder creep between the mounting region and the soldering region in comparison with a carrier without a solder barrier. In this case, the solder barrier can be entirely covered by the covering material or else, as an alternative thereto, can at least partly project from the covering material. Furthermore, it can also be possible for the solder barrier arranged at the interface between the carrier and the covering material to be arranged entirely outside the covering and furthermore to adjoin the interface.

In accordance with a further embodiment, the carrier extends along an extension direction from the soldering region to the mounting region. The solder barrier can be arranged in particular on that surface of the carrier which also has the mounting region. The solder barrier can advantageously be arranged on said surface transversely with respect to the extension direction and can extend in particular transversely with respect to the extension direction on said surface over the entire carrier. As a result, it can be possible that on the surface having the mounting region, along the interface between the soldering region and the mounting region, there is no direct creep path for a solder past the solder barrier, such that the mounting region is shielded from the soldering region by the solder barrier.

In accordance with a further embodiment, the covering material encloses the carrier apart from the soldering region or apart from the soldering region and the mounting region. That can mean, in particular, that the covering material is embodied as a housing body which is molded onto the carrier and encloses the carrier apart from the soldering region or apart from the soldering region and the mounting region. In this case, the carrier can have at least one or a plurality of surfaces each having an interface with the covering material embodied as a housing body. The solder barrier can be arranged at at least one surface and in particular at that surface of the carrier which has the mounting region.

In accordance with a further embodiment, the carrier is embodied as a leadframe or at least as part of a leadframe. In particular, the carrier can in this case be embodied as a leadframe in a housing for an optoelectronic component or for an electronic component. In this case, the soldering region can be formed by a part of the leadframe which is led out from the housing. Particularly preferably, the carrier can comprise copper or copper alloys. Copper and copper alloys are distinguished as particularly suitable material for leadframes on account of their simple processability and their electrical and thermal conductivity. As an alternative thereto, the leadframe can also comprise further or other materials that are customary for leadframes.

In accordance with at least one further embodiment, the covering material comprises an epoxide or is formed from an epoxide. Alternatively or additionally, the covering material can also comprise a silicone, an acrylate and/or an imide or combinations thereof such as, for example, a silicone-epoxide hybrid material, for instance. Epoxides, in particular, are advantageously used for electronic or optoelectronic components for forming a housing body, since epoxides can have a high mechanical stability and also a certain radiation stability.

Furthermore, the carrier can comprise a coating which covers the carrier material and can thus protect it against harmful environmental influences, for example. The coating can be formed at least at the interface between the carrier and the covering material and particularly preferably in a manner enveloping the entire carrier, that is to say as a coating on all sides, wherein on all sides also means that, if appropriate, the solder barrier forms a region in which no or only part of the coating is present. In accordance with a further embodiment, the carrier has the coating at least at the interface between the carrier and the covering material, which coating can furthermore have a high wettability for a solder. Such a high wettability can advantageously serve for facilitating the solderability of the soldering region.

In particular, the coating can comprise an alloy comprising nickel and/or palladium and/or gold. Alloys comprising nickel and/or palladium and/or gold, for example PdAu or NiPdAu or NiAu, can be particularly suitable for protecting the carrier material, in particular copper, against harmful influences. In addition, such alloys have a high wettability for solders, in particular for tin-based solders. In particular the surface energy conditions in the case of a palladium, a gold and in particular in the case of a PdAu coating result in a high wettability by liquid solder, in particular by liquid tin, on account of a small contact angle of wetting. On account of the high wettability of such a coating in particular also by the tin in the solder, the latter can creep very easily along the interface between the carrier and the covering material and thus creep for example during the soldering of the carrier device by means of the soldering region for example onto a circuit board or a printed circuit board from the soldering region in the direction of the mounting region and cover the carrier in this case. The solder barrier can at least reduce or even completely prevent this effect. Since the creep effect occurs only as long as the temperatures of the carrier device are high enough that the solder is present in a liquid state, a reduction or prevention of the creep effect by the solder barrier means, in particular, that the creep rate of the solder is reduced by the solder barrier in such a way that the solder or constituents of the solder can no longer pass as far as the mounting region during a customary soldering process.

As a result, the creep effect can advantageously be kept under control and is predictable in the context of customary soldering processes such as a reflow soldering process, for instance.

Furthermore, the coating can also comprise a layer sequence having a plurality of layers comprising the above-mentioned materials or combinations or alloys thereof. By way of example, the coating can comprise a layer comprising nickel, thereabove a layer comprising palladium and thereabove a layer comprising gold. In particular, the layers can be composed of the materials mentioned. In the case, too, of a layer sequence as coating, the latter can particularly preferably be embodied as a coating on all sides on the carrier.

In accordance with a further embodiment, the solder barrier comprises a material having a lower wettability by a solder than the carrier. In particular, that can mean that the solder barrier comprises a material having a lower wettability by a solder than the carrier material or a coating of the carrier. A suitable material can be silver or comprise silver, for example, which, in particular for tin-based solders, has a lower wettability in comparison with palladium- and/or gold-containing coatings for the carrier. Alternatively or additionally, the material can also be nickel, which can likewise form a good creep stop for solders.

In accordance with a further embodiment, the solder barrier can comprise a material that is soluble in a solder. That can mean, in particular, that the material of the solder barrier is dissolved in the solder if the latter creeps along the interface to the solder barrier. In this case, the material of the solder barrier can form an alloy with the solder, which alloy has, at the interface between the carrier and the covering material, a lower creep rate and a higher wetting than the solder alone. Such a material can comprise silver or be silver, for example, in particular for tin-based solders, for example. In this case, the solder barrier can be embodied as a corresponding coating of the carrier. Silver is soluble in tin and forms with tin an alloy having a lower creep rate than pure tin for example on a palladium and/or gold coating on the carrier.

If silver is used as leadframe coating in known LEDs, then it is necessary in the case of said LEDs to cover the silver coating by a subsequent tin coating in order to prevent the silver from oxidizing. Such a tin coating is usually applied by means of an electrolytic method, which is disadvantageous, however, on account of environmental aspects and for cost reasons and is therefore avoided if possible in the prior art. In the case of the carrier device described here, by contrast, the solder barrier, and in the case mentioned in particular the solder barrier comprising the silver, is arranged between the carrier and the covering material and thereby protected from the surroundings, such that a protective coating of the silver required in the prior art is not necessary.

If the carrier has a coating then the solder barrier can comprise the above-mentioned material on the coating. As an alternative thereto, the material of the solder barrier can also be arranged in the coating, such that the material of the solder barrier is arranged instead of the coating material or part thereof.

In accordance with a further embodiment, the solder barrier has a depression. The depression can be advantageous in particular in conjunction with an above-described coating on the carrier which has a high wettability for the solder. In particular, in this case the depression can interrupt the coating and reach through the coating into the carrier material. In this case, the solder barrier has the surface of the carrier material exposed by the coating, which carrier material advantageously has a lower wettability by the solder than the coating. By virtue of the fact that the solder barrier is arranged between the covering material and the carrier, the region of the carrier which is free of the coating on account of the solder barrier can also be protected against harmful external influences by the covering material. As an alternative thereto, in the case of a coating comprising a layer sequence composed of a plurality of layers, the depression can project only through one or a plurality of layers of the coating as far as an underlying layer of the coating, but at least one underlying layer of the coating still covers the carrier. Furthermore, the interface between the covering material and the carrier can advantageously be enlarged by the depression, such that a lengthening of a possible creep path between the soldering region and the mounting region can be achieved.

In accordance with a further embodiment, the carrier device comprises at least one further bondable and/or solderable metallic carrier. In this case, the further metallic carrier can have one or more of the above-mentioned features of the metallic carrier in accordance with the previous embodiments. In particular, the further metallic carrier can be at least partly covered by the covering material, wherein a further solder barrier is arranged at an interface between the further carrier and the covering material. The further solder barrier can have one or more of the abovementioned features of the solder barrier in accordance with the previous embodiments. The further carrier can have for example a further mounting region for a further semiconductor chip or a bonding region for connecting a semiconductor chip for example by means of a bonding wire.

In accordance with a further embodiment, in a method for producing a solder barrier having a depression, the depression is introduced into the carrier by means of a mechanical, chemical or thermal process. By way of example, a depression can be scribed into the carrier. As an alternative or in addition thereto, a depression can be shaped in the carrier by means of an etching process. Furthermore, it is alternatively or additionally possible to shape a depression in the carrier by means of a laser. These measures can make it possible to achieve a surface that is non-wettable or at least wettable to a lesser extent in the region of the solder barrier in comparison with the rest of the surface of the carrier.

In accordance with at least one further embodiment, an electronic component comprises a carrier device in accordance with one or more of the abovementioned embodiments. The electronic component can be embodied for example as an integrated circuit, that is to say as a so-called IC chip, or else as a discrete component. In particular, the electronic component comprises a semiconductor chip arranged on the carrier device. In particular, the semiconductor chip is arranged on the mounting region. By means of the soldering region of the carrier device, the electronic component can be soldered onto a circuit board, for example. The electronic component can furthermore comprise a housing which is formed by the covering material and which is molded onto the carrier.

In accordance with at least one further embodiment, an optoelectronic component comprises a carrier device in accordance with one or more of the above-mentioned embodiments. Furthermore, the optoelectronic component comprises an optoelectronic semiconductor chip on the mounting region of the carrier device. The covering material can be molded as a housing body onto the carrier, wherein the optoelectronic semiconductor chip is arranged in the housing.

In accordance with at least one embodiment, the optoelectronic semiconductor chip is embodied as a radiation-emitting semiconductor chip, in particular as a radiation-emitting semiconductor layer sequence, for example as a light-emitting diode or as a laser diode. As an alternative thereto, the optoelectronic semiconductor chip can for example also be embodied as a radiation-receiving semiconductor chip, for example as a photodiode.

The solder barrier described above makes it possible to reduce or even entirely prevent solder creep from the soldering region to the mounting region along an interface between a carrier and a covering material that at least partly covers the carrier. As a result, it is possible to achieve a high or even hermetic sealing of the mounting region with regard to the solder, as a result of which a higher reliability for example of electronic or optoelectronic components can advantageously be achieved.

BRIEF DESCRIPTION OF THE DRAWINGS

Further advantages and advantageous embodiments and developments will become apparent from the embodiments described below in conjunction with FIGS. 1A to 5.

FIGS. 1A and 1B show schematic illustrations of a carrier device in accordance with one exemplary embodiment; and FIGS. 2A to 5 show schematic illustrations of exerts from carrier devices in accordance with further exemplary embodiments.

Figure 3A:
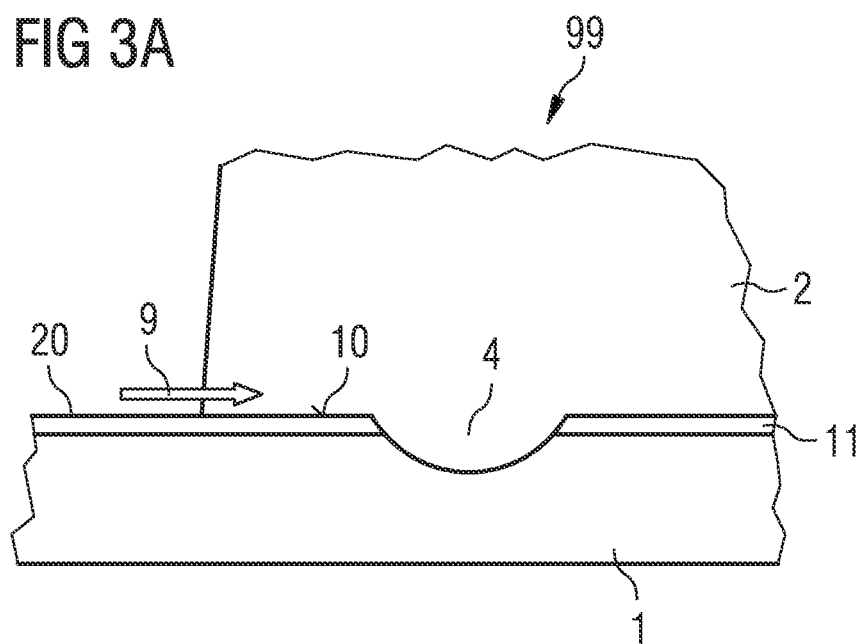

In the exemplary embodiments and figures, identical or identically acting constituent parts may in each case be provided with the same reference signs. The illustrated elements and their size relationships among one another should not be regarded as true to scale, in principle; rather, individual elements, such as, e.g., layers, structural parts, components and regions, may be illustrated with exaggerated thickness or size dimensions in order to enable better illustration and/or in order to afford a better understanding.

DETAILED DESCRIPTION OF ILLUSTRATIVE EMBODIMENTS

FIGS. 1A and 1B show a carrier device 100 for a semiconductor chip 3, wherein the semiconductor chip 3 is indicated by the dashed line. In this case, FIG. 1A shows a sectional illustration of the carrier device 100, while FIG. 1B shows a plan view of the carrier 1, 1' of the carrier device 100 at the interfaces 10, 10' in FIG. 1A. The following description relates equally to both FIGS. 1A and 1B.

The carrier device 100 comprises a bondable and/or solderable metallic carrier 1 and also a further bondable and/or solderable metallic carrier 1', which, in the exemplary embodiment shown, are embodied as leadframes and are typically composed of copper or a copper alloy. Furthermore, the carriers 1, 1' can have, in addition to the carrier material composed of copper or a copper alloy, a coating (not shown), in particular an electrolytic coating, which firstly serves as protection against corrosion and secondly provides suitable surfaces that are suitable for soldering and/or bonding. Such a coating, as is also shown in the subsequent exemplary embodiments, can be for example an NiPdAu alloy or, as an alternative thereto, can also comprise or be composed of other alloys and/or layer sequences for example comprising Ni, Pd and/or Au.

The carrier 1 has a mounting region 21 for the semiconductor chip 3 indicated, while the further carrier 1' has a mounting region 21' in the form of a contact region or bonding region for connecting a bonding wire, indicated in a dashed manner. The carriers 1, 1' respectively have a soldering region 20, 20', by means of which the carrier device 100 can be soldered for example to contacts of a circuit board or a printed circuit board. The dashed lines at the soldering regions 20, 20' indicate the customary regions of the carriers 1, 1' at which solder can and is intended to be present after the soldering of the carrier device 100. However, it is usually undesirable if solder also creeps along the carriers 1, 1' to further regions.

The form of the carriers 1, 1' shown should be understood purely by way of example and in a non-limiting manner. Rather, the carriers 1, 1' can also have any other suitable form adapted to the respective requirements. As an alternative to the exemplary embodiment shown, the carrier device 100 can also comprise only one carrier 1 or more than the two carriers 1, 1' shown, wherein mounting regions can also be arranged on a plurality of carriers and, for example, it is also possible for at least one carrier to have more than one mounting region and/or more than one soldering region.

Furthermore, the carrier device 100 comprises a covering material 2, which, in the exemplary embodiment shown, is composed of epoxide or a silicone or a silicone-epoxide hybrid material and covers completely apart from the soldering regions 20, 20' of the carriers 1, 1'. In particular, the covering material 2 is embodied as a housing that serves for encapsulating the semiconductor chip 3. As an alternative thereto, the covering material 2 can for example also be arranged only between the soldering regions 20, 20' and the mounting region 21, such that in addition to the soldering regions 20, 20' for example the mounting region 21, too, is not covered by the covering material 2. Furthermore, the covering material 2 can have a depression or opening for example in the region of the mounting region 21, such that the mounting region 21 remains accessible for the later mounting of a semiconductor chip 3, whereas in the exemplary embodiment shown it is necessary to arrange the semiconductor chip 3 on the carrier 1 before the covering material 2 is applied.

As an alternative to being shaped as a housing, the covering material can for example also be arranged as a frame around the mounting region 21 and can in this case also be embodied as a soldering resist, for example.

Between the carrier 1, 1' and the covering material 2 there is a respective interface 10, 10', which can have permeation paths and creep paths for solder on account of the respective material properties and manufacturing processes, such that during the soldering of the carrier device 100 to a circuit board, for example, solder can creep from the soldering regions 20, 20' along the interfaces 10, 10' in the direction of the mounting region 21, as is indicated by the arrows 9.

In order to prevent such solder creep 9 into the carrier device 100 and the associated undesirable coverage of the carriers 1, 1' under the covering 2 with solder, the carrier 1 has a solder barrier 4 at the interface 10 between the soldering region 20 and the mounting region 21, while the further carrier 1' has a further solder barrier 4' at the further interface 10' between the soldering region 20' and the mounting region 21', both solder barriers 4, 4' extending perpendicularly to a respective extension direction from the respective soldering region 20, 20' toward the mounting region 21 transversely over the carrier 1 and the further carrier 1', respectively. As a result, it is possible to prevent a direct creep path between the soldering regions 20, 20' along the interfaces 10, 10' in the direction toward the mounting region 21.

Further features of the carrier device 100 and exemplary embodiments of the solder barriers 4, 4' are explained in association with FIGS. 2A to 5.

The carrier device 100, the carriers 1, 1' and the covering material 2 are embodied purely by way of example in the exemplary embodiment shown and can alternatively or additionally comprise one or more features as described above in the general part.

In accordance with one further exemplary embodiment (not shown), an electronic component can comprise a carrier device 100 in accordance with the abovementioned exemplary embodiment and an electronic semiconductor chip 3 on the carrier device 100.

In accordance with yet another exemplary embodiment (not shown), an optoelectronic component can comprise a carrier device 100 in accordance with the abovementioned exemplary embodiment and an optoelectronic semiconductor chip 3 on the carrier device 100, for example a light-emitting diode, a laser diode or a photodiode.

FIGS. 2A to 5 show different exemplary embodiments of solder barriers 4 for the carrier device in accordance with the above-mentioned exemplary embodiments, wherein the illustrations in FIGS. 2A to 5 correspond to the exert 99 in FIG. 1A. The following description of the exemplary embodiments of the solder barrier 4 on the carrier 1 correspondingly also applies to the further solder barrier 4' on the further carrier 1'.

Figure 3B:
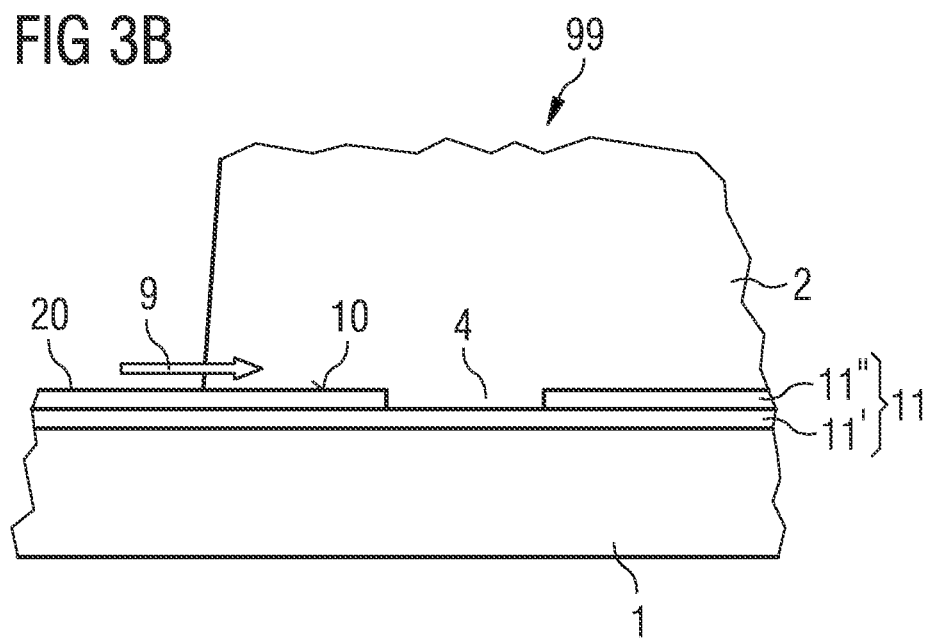

Furthermore, in the exemplary embodiments in FIGS. 2A to 5 the carrier 1 has a coating 11 which, apart from in the exemplary embodiment in FIG. 3B, comprises a nickel- and/or palladium- and/or gold-containing alloy, in particular a PdAu or NiPdAu alloy, which firstly protects the carrier 1 against harmful influences and secondly has a high wettability in particular for tin-containing solders. As a result, the solderability of the soldering region 20 can advantageously be increased.

In accordance with the exemplary embodiment in FIG. 2A, the solder barrier 4 comprises a material having a lower wettability by the solder than the carrier 1 or the coating 11. In particular, in the exemplary embodiment shown, the solder barrier 4 comprises silver or is composed of silver, which has a lower wettability for solders, in particular for tin-based solders, in comparison with the PdAu or NiPdAu coating 11 of the carrier 1. As an alternative thereto, the solder barrier can also be composed of nickel, which can bring about a good creep stop for solders. As a result, during a soldering process wherein the carrier device 100 is soldered by the soldering region 20 for example to a contact of a circuit board or of a printed circuit board, it is possible to reduce or completely prevent solder creep, indicated by the arrow 9, at the interface 10 from the soldering region 20 to the mounting region 21.

Whereas the solder barrier 4 is arranged on the coating 11 in the exemplary embodiment in accordance with FIG. 2A, the solder barrier 4 can also be formed in the coating 11 in accordance with the further exemplary embodiment in FIG. 2B.

In accordance with the exemplary embodiment in FIG. 3A, the solder barrier 4 has a depression. The depression is advantageous in particular in conjunction with the above-described coating 11 on the carrier that has a high wettability for solders. The depression interrupts the coating 11 and reaches through the coating 11 into the carrier 1 and the carrier material. As a result of the depression, the carrier 1 in the region of the solder barrier 4 has a lower wettability by solder than the coating, such that solder creep, as indicated by the arrow 9, can thereby be reduced or completely prevented. Furthermore, the interface 10 between the covering material 2 and the carrier 1 can advantageously be enlarged by the solder barrier 4 embodied as a depression, such that a lengthening of a possible creep path between the soldering region 20 and the mounting region 21 can be achieved.

In accordance with the exemplary embodiment in FIG. 3B, a modification of the previous exemplary embodiment is shown, wherein the coating 11 comprises a layer sequence composed of a plurality of layers 11', 11", of which the layer 11' can be a nickel layer, for example, and the layer 11" thereabove can be a PdAu layer or an Au layer. Even further or other layers can also be arranged on the layer 11". In the exemplary embodiment shown, the solder barrier 4 is embodied as a depression which extends only through part of the coating 11 and projects into the coating 11 as far as the layer 11". In a manner similar to that in the exemplary embodiments in FIGS. 2A and 2B, the nickel of the layer 11" that is thus exposed at the interface 10 in the region of the solder barrier 4 can form a creep stop on account of the wetting properties of said nickel for solder.

Figure 4:
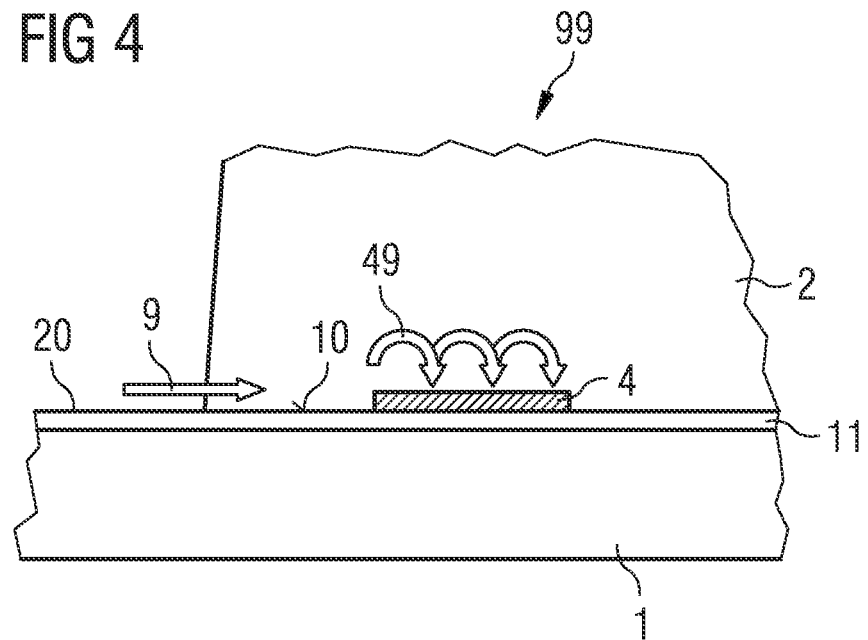

In accordance with the exemplary embodiment in FIG. 4, the solder barrier 4 comprises a material that is soluble in a solder, such that the material of the solder barrier 4 is dissolved in the solder, as is indicated by the arrows 49, if the solder creeps along the interface 10 to the solder barrier. The material of the solder barrier 4, which, in the exemplary embodiment shown, comprises silver or is composed of silver, forms with the solder an alloy having, at the interface 10 between the carrier 1 and the covering material 2, a lower creep rate and a higher wetting of the carrier 1 or of the coating 11 than the solder alone. As a result, the creep rate of the solder along the creep path indicated by the arrow 9 at the interface 10 is reduced or can even come completely to a standstill.

The embodiment of the solder barrier 4, 4' in accordance with the exemplary embodiments shown is dependent, in particular, on the materials of the carrier 1, if appropriate of the coating 11 and of the solder, which influence the creep rate of the solder and the intensity of the creep effect or of the capillary effect at the interface 10. In the exemplary embodiments shown with a PdAu or NiPdAu coating 11, the solder barrier 4, 4' particularly preferably has a length along the extension direction from the soldering region 20, 20' to the mounting region 21 of greater than or equal to 50 and less than or equal to 300 µm, in order to prevent an "overflow" of the solder barrier 4, 4' by tin. Furthermore, in addition to the exemplary embodiments shown in FIGS. 2 and 4, it can be possible for the solder barrier 4, 4', instead of a layer, to be embodied as a three-dimensional structure, for instance as an elevation, on the carrier 1, 1'. Furthermore, it can also be possible for the solder barrier 4, 4' to be arranged on further surfaces of the carrier 1, 1'.

Figure 5:
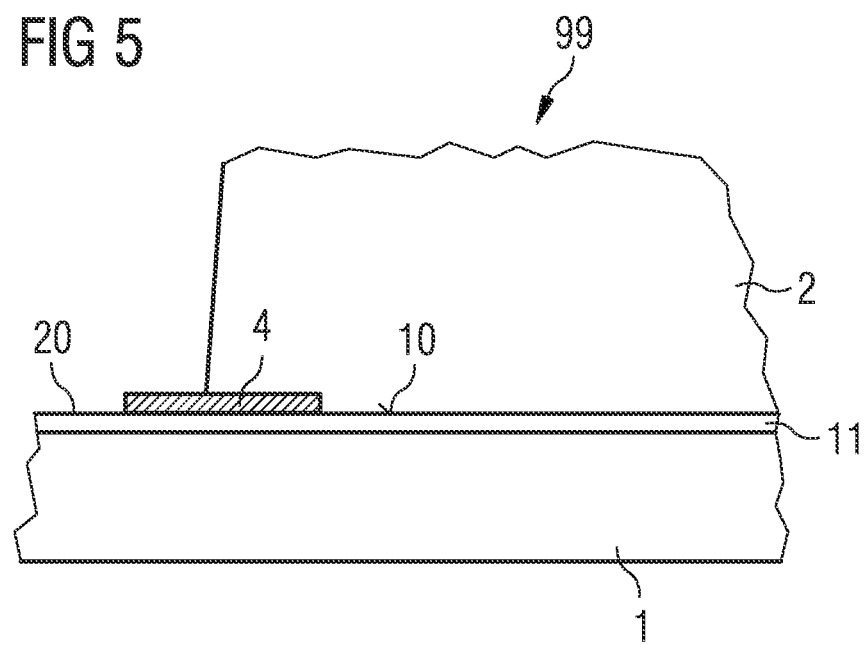

As an alternative to the exemplary embodiments shown, the solder barrier 4, 4' can also project at least partly from the covering material 2, as is shown in FIG. 5. As an alternative thereto, in accordance with a further exemplary embodiment, the solder barrier 4, 4' can also be arranged entirely outside the covering material 2 and adjoin the interface 10, 10' (not shown).

In order to achieve a reinforcement of the barrier effect, it is also possible for a plurality of solder barriers 4, 4' and/or combinations of the above-described solder barriers 4, 4' to be arranged on the carrier 1. By way of example, the solder barriers 4, 4' can also be embodied in a multi-stage manner. That can mean, in particular, that a plurality of identical or different solder barriers 4, 4' are arranged one behind another between the respective soldering region 20, 20' and the respective mounting region 20, 20'.

Furthermore, the solder barriers 4, 4' in accordance with the exemplary embodiments shown can be arranged not just at the interface 10, 10', but rather can for example also be embodied in a manner extending circumferentially around the respective carrier 1, 1', such that a solder stop can be brought about on all sides at the carriers 1, 1'.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A carrier device for a semiconductor chip comprising:
a bondable and/or solderable metallic carrier having a mounting region for the semiconductor chip and a soldering region;
a covering material, wherein the carrier is at least partly covered with the covering material; and
a solder barrier arranged between the soldering region and the mounting region at an interface between the carrier and the covering material, wherein the solder barrier comprises a material having a lower wettability by a solder than the carrier;
wherein the carrier has a surface that comprises the mounting region and on which the solder barrier is arranged and over which the solder barrier extends transversely with respect to an extension direction from the soldering region to the mounting region.

2. The carrier device according to claim 1, wherein the covering material encloses the carrier apart from the soldering region.

3. The carrier device according to claim 1, wherein the covering material encloses the carrier apart from the soldering region and the mounting region.

4. The carrier device according to claim 1, wherein the carrier comprises copper or a copper alloy.

5. The carrier device according to claim 1, wherein the solder barrier comprises a material that is soluble in a solder.

6. The carrier device according to claim 1, wherein the covering material comprises an epoxide or a silicone or a silicone-epoxide hybrid material.

7. An electronic component comprising a carrier device according to claim 1 and a semiconductor chip on the carrier device.

8. A carrier device for a semiconductor chip comprising:
a bondable and/or solderable metallic carrier having a mounting region for the semiconductor chip and a soldering region;
a covering material, wherein the carrier is at least partly covered with the covering material;
a solder barrier arranged between the soldering region and the mounting region at an interface between the carrier and the covering material, wherein the solder barrier comprises a material having a lower wettability by a solder than the carrier; and
a further bondable and/or solderable metallic carrier that is at least partly covered by the covering material, wherein a further solder barrier is arranged at a further interface between the further carrier and the covering material.

9. A carrier device for a semiconductor chip comprising:
a bondable and/or solderable metallic carrier having a mounting region for the semiconductor chip and a soldering region;
a covering material, wherein the carrier is at least partly covered with the covering material; and
a solder barrier arranged between the soldering region and the mounting region at an interface between the carrier and the covering material, wherein the solder barrier comprises a material having a lower wettability by a solder than the carrier;
wherein the carrier is a leadframe or a part of a leadframe.

10. A carrier device for a semiconductor chip comprising:
a bondable and/or solderable metallic carrier having a mounting region for the semiconductor chip and a soldering region;
a covering material, wherein the carrier is at least partly covered with the covering material; and
a solder barrier arranged between the soldering region and the mounting region at an interface between the carrier and the covering material, wherein the solder barrier comprises a material having a lower wettability by a solder than the carrier; and
wherein the carrier comprises, at least at the interface, a coating having a high wettability for a solder.

11. The carrier device according to claim 10, wherein the coating comprises an alloy and/or a layer sequence comprising one or more materials selected from the group consisting of nickel, palladium and gold.

12. The carrier device according to claim 10, wherein the coating comprises an alloy and/or a layer sequence comprising palladium.

13. A carrier device for a semiconductor chip comprising:
a bondable and/or solderable metallic carrier having a mounting region for the semiconductor chip and a soldering region;
a covering material, wherein the carrier is at least partly covered with the covering material; and
a solder barrier arranged between the soldering region and the mounting region at an interface between the carrier and the covering material, wherein the solder barrier comprises a material having a lower wettability by a solder than the carrier, wherein the solder barrier has a depression.

14. A carrier device for a semiconductor chip comprising:
a bondable and/or solderable metallic carrier having a mounting region for the semiconductor chip and a soldering region;
a covering material, wherein the carrier is at least partly covered with the covering material; and
a solder barrier arranged between the soldering region and the mounting region at an interface between the carrier and the covering material, wherein the solder barrier comprises a material having a lower wettability by a solder than the carrier;
wherein the solder barrier comprises a material that is soluble in a solder; and
wherein the material forms an alloy with the solder, wherein the alloy has, at the interface, a lower creep rate than the solder.

15. An optoelectronic component comprising:
a carrier device comprising:
  a bondable and/or solderable metallic carrier having a mounting region and a soldering region;
  a covering material, wherein the carrier is at least partly covered with the covering material; and
  a solder barrier arranged between the soldering region and the mounting region at an interface between the carrier and the covering material, wherein the solder barrier comprises a material having a lower wettability by a solder than the carrier; and
an optoelectronic semiconductor chip on the mounting region of the carrier device, wherein the covering material is molded as a housing body onto the carrier and the optoelectronic semiconductor chip is arranged in the housing body.

16. A carrier device for a semiconductor chip comprising:
a bondable and/or solderable metallic carrier having a mounting region for the semiconductor chip and a soldering region;
a covering material, wherein the carrier is at least partly covered with the covering material; and
a solder barrier arranged between the soldering region and the mounting region at an interface between the carrier and the covering material, wherein the solder barrier has a depression.

17. A carrier device for a semiconductor chip comprising:
a bondable and/or solderable metallic carrier having a mounting region for the semiconductor chip and a soldering region;
a covering material, wherein the carrier is at least partly covered with the covering material; and
a solder barrier arranged between the soldering region and the mounting region at an interface between the carrier and the covering material, wherein the solder barrier comprises a material that is soluble in a solder.

* * * * *